United States Patent
Nurani et al.

(10) Patent No.: US 11,916,567 B2
(45) Date of Patent: Feb. 27, 2024

(54) CURRENT-BASED TRACK AND HOLD CIRCUIT

(71) Applicant: TEXAS INSTRUMENTS INCORPORATED, Dallas, TX (US)

(72) Inventors: Sai Aditya Krishnaswamy Nurani, Hyderabad (IN); Joseph Palackal Mathew, Podimattom (IN); Prasanth K, Ottapalam (IN); Visvesvaraya Appala Pentakota, Bengaluru (IN); Shagun Dusad, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/570,658

(22) Filed: Jan. 7, 2022

(65) Prior Publication Data

US 2022/0131551 A1 Apr. 28, 2022

Related U.S. Application Data

(62) Division of application No. 16/850,597, filed on Apr. 16, 2020, now Pat. No. 11,277,145.

(51) Int. Cl.
*H03M 1/12* (2006.01)
*G11C 27/02* (2006.01)

(52) U.S. Cl.
CPC ........... *H03M 1/1245* (2013.01); *G11C 27/02* (2013.01); *H03M 1/121* (2013.01)

(58) Field of Classification Search
CPC ...... H03M 1/245; H03M 1/1245; H03M 1/12; H03M 1/00; H03M 1/001; G11C 27/02; G11C 27/024; G11C 27/026

USPC .................................... 327/55, 91, 94, 95, 96
See application file for complete search history.

(56) References Cited

U.S. PATENT DOCUMENTS

| 4,331,982 | A | 5/1982 | Parker |
| 5,350,952 | A | 9/1994 | Cheng et al. |
| 6,329,848 | B1 | 12/2001 | Maes et al. |
| 11,277,145 | B2 * | 3/2022 | Nurani ................ H03M 1/1245 |

FOREIGN PATENT DOCUMENTS

JP 2009230842 A 10/2009

OTHER PUBLICATIONS

Search Report for Application No. PCT/US 2021/027385, dated Jul. 8, 2021.

* cited by examiner

*Primary Examiner* — Hai L Nguyen
(74) *Attorney, Agent, or Firm* — John R. Pessetto; Frank D. Cimino

(57) ABSTRACT

An example sample-and-hold circuit includes a first and second input resistors, each having first and second terminals; first and second transistors coupled in series between the second terminals of the first and second input resistors; and third and fourth input resistors, each having first and second terminals; and third and fourth transistors coupled in series between the second terminals of the third and fourth input resistors. A first capacitor is coupled between the first and second transistors and a second capacitor is coupled between the third and fourth transistors. The control terminals of the first and third transistors are coupled together, and the control terminals of the second and fourth transistors are coupled together.

12 Claims, 8 Drawing Sheets

CURRENT-BASED TRACK AND HOLD CIRCUIT

CROSS-REFERENCE TO RELATED APPLICATION(S)

This application is a divisional of, and claims priority under 35 U.S.C. § 119 to, application Ser. No. 16/850,597, entitled "CURRENT-BASED TRACK AND HOLD CIRCUIT", filed Apr. 16, 2020, now U.S. Pat. No. 11,277,145 B2 issued on Mar. 15, 2022 and assigned to the assignee of the present application. The content of this prior application is incorporated by reference herein in its entirety.

BACKGROUND

Sample-and-hold circuits are used in a variety of applications. For example, a sample-and-hold circuit can be used to sample an analog voltage to then be converted to a digital value by an analog-to-digital converter (ADC). Some sample-and-hold/ADC systems benefit from faster sample and conversion. As speeds increase, the amount of time to sample and hold the input signal and to process it through the ADC decreases. A traditional way of sampling the input with minimal distortion is to employ the bootstrapping technique in which a fixed voltage is applied (bootstrapped) between the gate of a transistor (e.g., a metal oxide semiconductor field effect transistor (MOSFET)) and its source. Bootstrapping ensures that the overdrive voltage of the transistor remains constant independent of the input voltage. In bootstrapping, there is an initial delay in which the output (e.g., drain) is charged to a fixed voltage during an initial charging phase when the transistor is turned on. Then, during a subsequent tracking phase, the output tracks the sum of the input and the fixed voltage. Bootstrapping a transistor switch generally requires additional transistors and a capacitor. The time needed for the charging and tracking phases of a bootstrapped transistor will contribute to a limit on the conversion speeds of an ADC.

SUMMARY

In an example, a sample-and-hold (S/H) circuit comprises first and second input resistors, each having first and second terminals; first and second transistors coupled in series between the second terminals of the first and second input resistors; third and fourth input resistors, each having first and second terminals; third and fourth transistors coupled in series between the second terminals of the third and fourth input resistors. Control terminals of the first and third transistors are coupled together, and control terminals of the second and fourth transistors are coupled together.

BRIEF DESCRIPTION OF THE DRAWINGS

For a detailed description of various examples, reference will now be made to the accompanying drawings in which.

DETAILED DESCRIPTION

As signal speeds increase, a sample-and-hold circuit (also referred to as a "sample-and-hold" (S/H)) may limit the linearity and dynamic range of the system. The examples described herein are directed to a sample and hold that converts the input voltage to be sampled to a current and, in so doing, avoids the need for bootstrapping and level-shifted clocks.

Figure 1:
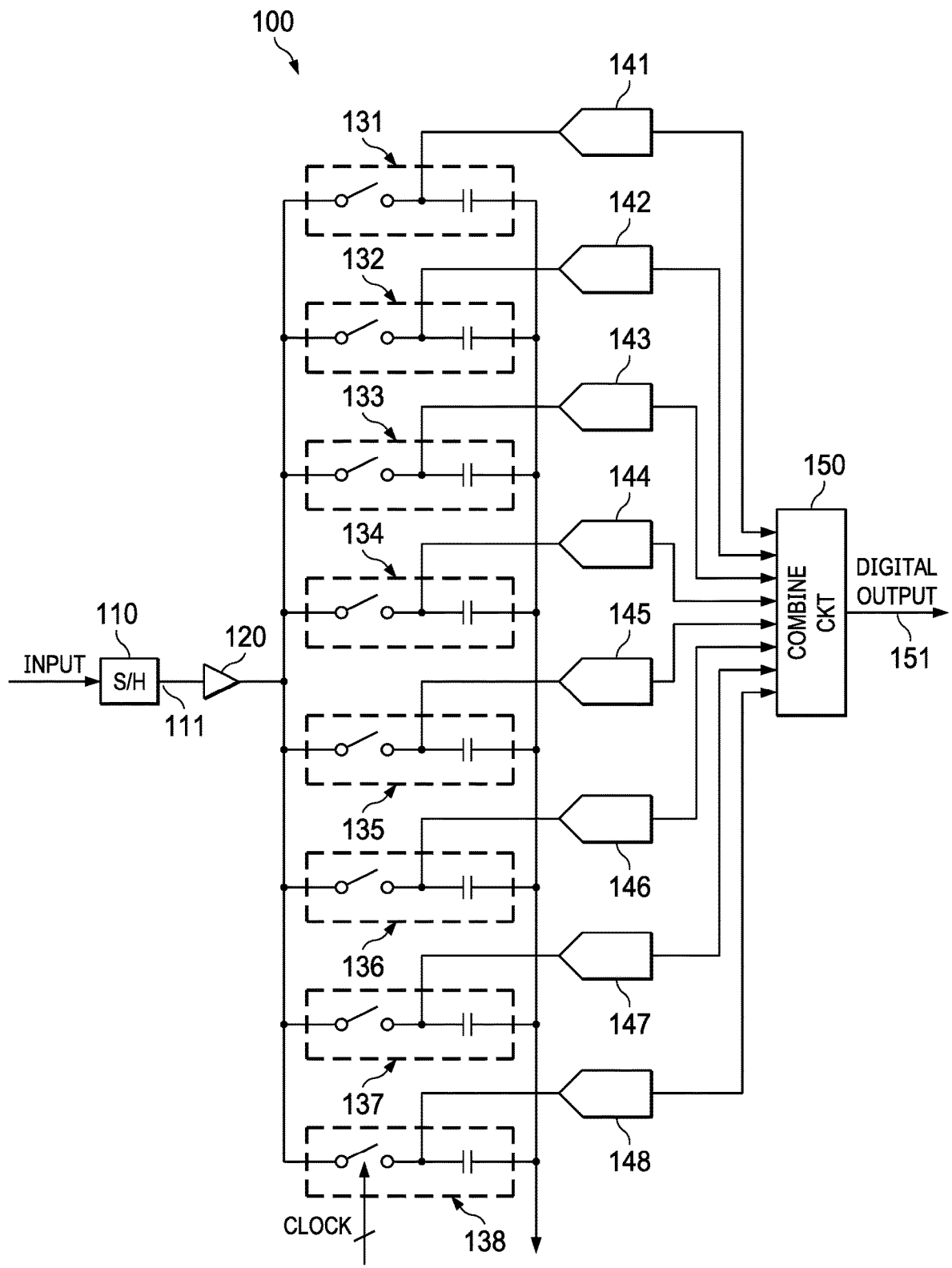
FIG. 1 illustrates a system including a sample-and-hold circuit coupled to a set of interleaved analog-to-digital converters.

FIG. 1 shows an example of a system 100 that includes a S/H 110, a buffer 120, a set of samplers 131-138, a set of interleaved ADCs 141-148, and a combine circuit 150. The S/H 110 samples the input signal (INPUT) and holds the sampled signal on its output 111. The sampled signal on output 111 is provided through buffer 120 to the inputs of the interleaved samplers 131-138. The interleaved samplers 131-138 are clocked sequentially, and the output of a given clocked sampler 131-138 is provided to an input of a corresponding ADC 141-148. The digital outputs of the ADCs 141-148 are combined by combine circuit 150 (e.g., a multiplexer) to provide the digital output 151.

The S/H 110 operates at the full speed of the system, but each interleaved sampler 131-138 and corresponding ADC 141-148 operates at a substantially lower rate. The example of FIG. 1 includes eight samplers 131-138 and eight ADCs 141-148. As such, each sampler and corresponding ADC operates at one-eighth the rate of the input S/H 110. In an example in which INPUT is to be sampled at 10 GSPS, S/H 110 operates at the full rate of 10 GSPS, but each interleaved sampler and ADC operates at one-eighth of 10 GSPS (i.e., 1.25 GSPS) thereby relaxing the speed requirements of the interleaved samplers. In this architecture, S/H 110 operates at a much faster rate than the interleaved samplers 131-138. The examples described herein are directed to implementations of a sample-and-hold that is capable of relatively high speed operation (e.g., 10 GSPS).

Figure 2:
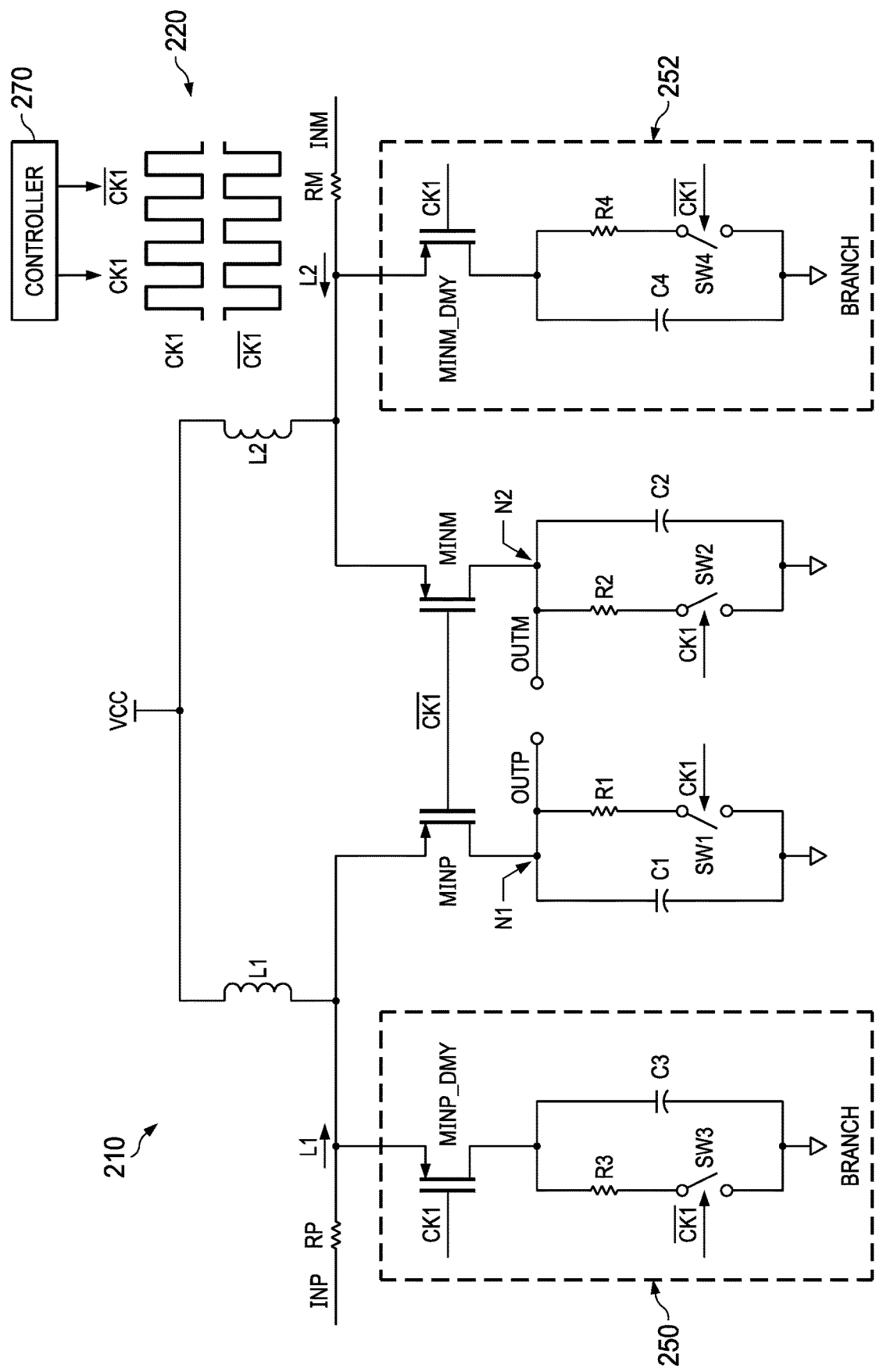
FIG. 2 shows an example of the sample-and-hold circuit of FIG. 1.

FIG. 2 shows an example of a S/H 210 that can be used to implement, for example, S/H 110 of FIG. 1. In the example of FIG. 2, the input signal to S/H 210 is a differential signal comprising INP and INM. The output signal from S/H 210 also is a differential signal comprising OUTP and OUTM. The S/H 210 includes resistors RP, RM, R1-R4, capacitors C1-C4, inductors L1 and L2, transistors MINP, MINM, MINP_DMY, and MINM_DMY, switches (which also may comprise transistors) SW1-SW4, and a controller 270. One terminal of RP represents the input that receives INP. Similarly, one terminal of RM represents the other input that receives INM. Switches SW1-SW4 comprise n-type metal oxide semiconductor field effect transistor switches (NMOS).

Transistors MINP, MINM, MINP_DMY, and MINM_DMY comprise p-type metal oxide semiconductor field effect transistors (PMOS). The opposing terminal of RP (from that of INP) is coupled to the sources of MINP and MINP_DMY and to inductor L1. The drain of MINP is coupled to C1 and R1. C1 is coupled to ground. SW1 is coupled between R1 and a common supply node such as ground (although alternatively, R1 and SW1 can be swapped with R1 being coupled between SW1 and the common supply node). The opposing terminal of RM (from that of INM) is coupled to the sources of MINM and MINM_DMY and to inductor L2. The drain of MINM is coupled to C2 and R2. C2 is coupled to ground. SW2 is coupled between R2 and ground (although alternatively, R2 and SW2 can be swapped with R2 being coupled between SW2 and ground). The drain of MINP_DMY is coupled to C3 and R3. C3 is coupled to ground. SW3 is coupled between R3 and ground (or vice versa, that is R3 is coupled between SW3 and ground). The combination of MINP_DMY, C3, R3, and SW3 is a branch circuit 250. The drain of MINM_DMY is coupled to C4 and R4. C4 is coupled to ground. SW4 is coupled between R4 and ground (or vice versa). The combination of MINM_DMY, C4, R4, and SW4 is a branch circuit 252. The opposing terminals of L1 and L2 (from that of the transistors to which the inductors are coupled) are coupled to the supply voltage node (VCC).

The controller 270 generates a clock signal (CK1) and its complement (CK1*bar*) as illustrated at 220 in FIG. 1. CK1 is control SW1 and SW2 and is coupled to the gates of MINP_DMY, and MINM_DMY. CK1*bar* is used to control SW3 and SW4 and is coupled to the gates of MINP and MINM. With MINP, MINM, MINP_DMY, and MINM_DMY comprising PMOS devices, MINP, MINM, MINP_DMY, and MINM_DMY are turned on when CK1 is low and off when CK1 is high. When on, MINP, MINM, MINP_DMY, and MINM_DMY are biased to operate in the linear region (e.g., the drain-to-source voltage of each of MINP, MINM, MINP_DMY, and MINM_DMY is at least a threshold voltage below the gate-to-source voltage of the respective transistor). As such, when on MINP, MINM, MINP_DMY, and MINM_DMY operate as transconductors. SW1-SW4 operate as switches and are either off (non-conducting) or are in saturation. SW1 and SW2 are turned on when CK1 is high and are off when CK1 is low. SW3 and SW4 are controlled by CK1*bar* and thus are turned on and off in an opposite fashion to SW1 and SW2. That is, when SW1 and SW2 are on, SW3 and SW4 are off, and vice versa. Inductors L1 and L2 function as current sources to provide bias current through MINP, MINM, MINP_DMY, and MINM_DMY. When SW1 and SW2 are off, SW3 and SW4 are turned on to maintain constant bias current through L1 and L2.

The voltage of INP causes a current L1 to flow through resistor RP. As such, RP converts the input voltage (INP) to a current L1. Similarly, the voltage of INM causes a current L2 to flow through resistor RM. As such, RM converts the input voltage (INM) to a current L2. When CK1 is high, SW1 and SW2 are turned on (are closed) and MINP and MINM are turned on as well. As such, current L1 (plus the bias current from L1) flows through MINP and to the combination of C1 and R1 to thereby charge C1 to voltage (OUTP) equal (or proportional) to INP. Similarly, current L2 (plus the bias current from L2) flows through MINM and to the combination of C2 and R2 to thereby charge C2 to voltage (OUTM) equal (or proportional) to INM. The differential output signal OUTP/OUTM is the output of S/H 210 and is provided to a downstream circuit (e.g., buffer 120 as in FIG. 1).

The architecture of FIG. 2 converts the input voltage to a current and avoids the need for bootstrapping and level-shifted clocks. The clock signals in FIG. 1 is CK1 and its complement.

Figure 3:
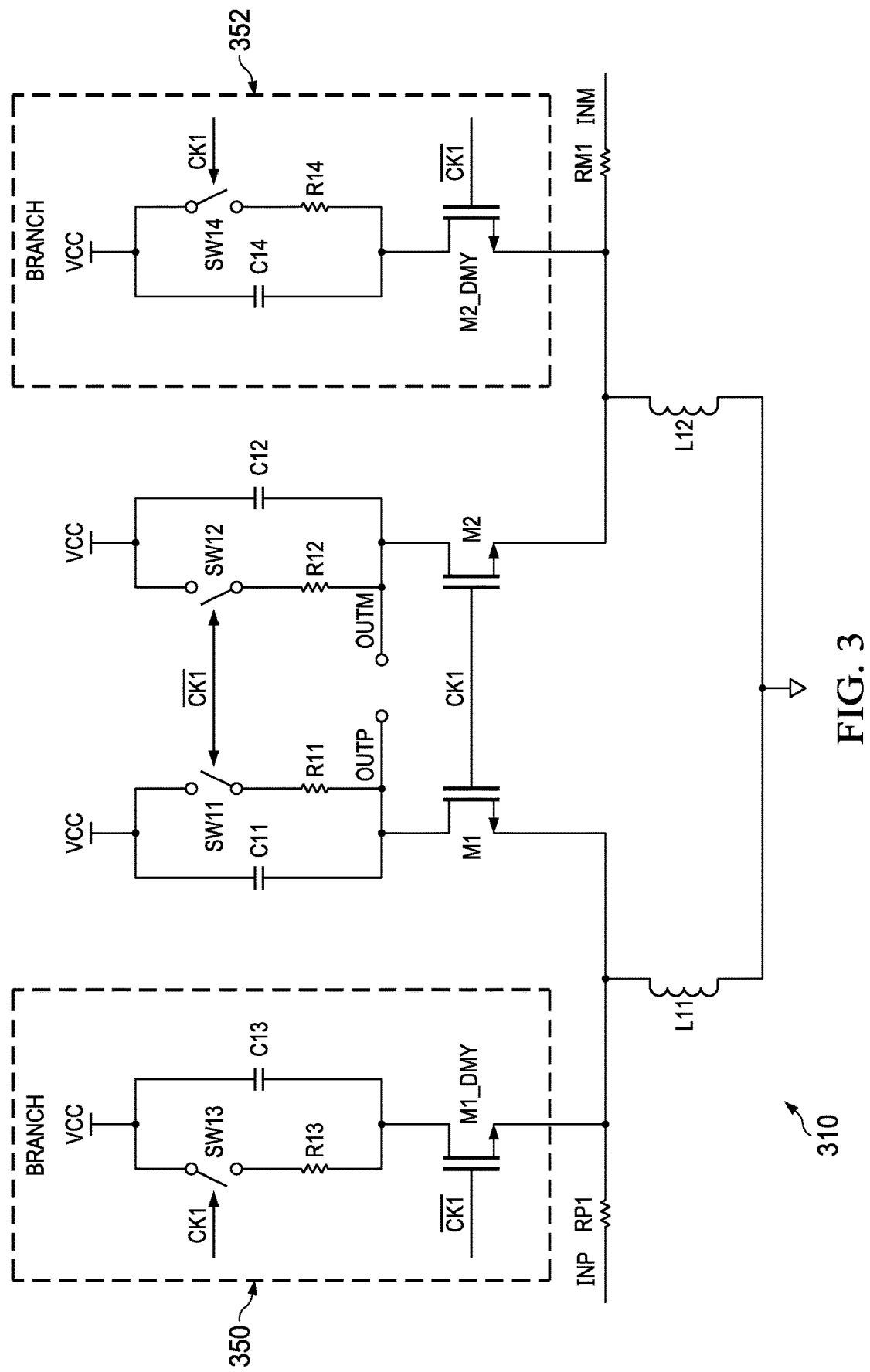
FIG. 3 shows another example of the sample-and-hold circuit of FIG. 1.

FIG. 3 shows an example of a S/H 310 that can be used to implement, for example, S/H 110 of FIG. 1. The S/H 310 of FIG. 3 is similar to that of the S/H 210 of FIG. 2 but with NMOS devices substituted for PMOS devices, and vice versa. S/H 310 includes a controller (e.g., controller 270 and not shown in FIG. 3) to generate the clocks CK1 and CK1*bar*. As was the case for S/H 210 of FIG. 2, the input signal to S/H 310 is a differential signal comprising INP and INM. The output signal from S/H 310 also is a differential signal comprising OUTP and OUTM. The S/H 310 includes resistors RP1, RM1, R11-R14, capacitors C11-C14, inductors L11 and L12, transistors M1, M2, M1_DMY, and M2_DMY, and switches (which also may comprise transistors) SW11-SW14. One terminal of RP1 represents the input that receives INP. Similarly, one terminal of RM1 represents the other input that receives INM. Switches SW11-SW14 comprise PMOS transistor switches.

Transistors M1, M2, M1_DMY, and M2_DMY comprise NMOS devices. The opposing terminal of RP1 (from that of INP) is coupled to the sources of M1 and M1_DMY and to inductor L11. The drain of M1 is coupled to C11 and R11. C11 is coupled to the supply voltage node (VCC). SW11 is coupled between R11 and ground (although alternatively, R11 and SW11 can be swapped with R11 being coupled between SW11 and VCC). The opposing terminal of RM1 (from that of INM) is coupled to the sources of M2 and M2_DMY and to inductor L12. The drain of M2 is coupled to C12 and R12. C12 is coupled to the supply voltage node. SW12 is coupled between R12 and the supply voltage node (although alternatively, R12 and SW12 can be swapped with R12 being coupled between SW12 and VCC). The drain of M1_DMY is coupled to C13 and R13. C13 is coupled to VCC. SW13 is coupled between R13 and VCC (or vice versa as noted above). The combination of M1_DMY, C13, R13, and SW13 is a branch circuit 350. The drain of M2_DMY is coupled to C14 and R14. C14 is coupled to VCC. SW14 is coupled between R14 and VCC (or vice versa as noted above). The combination of MINM_DMY, C4, R4, and SW4 is a branch circuit 352. The opposing terminals of L11 and L12 (from that of the transistors to which the inductors are coupled) are coupled to the ground node.

CK1*bar* is used to control SW11 and SW12 and is coupled to the gates of M1_DMY, and M2_DMY. CK1 is used to control SW13 and SW14 and is coupled to the gates of M1 and M2. With M1, M2, M1_DMY, and M2_DMY comprising NMOS devices, M1, M2, M1_DMY, and M2_DMY are turned on when CK1 is high and off when CK1 is low. When on, M1, M2, M1_DMY, and M2_DMY are biased to operate in the linear region. As such, when on M1, M2, M1_DMY, and M2_DMY operate as transconductors. SW11-SW14 operate as switches (e.g., PMOS transistor switches) and are either off or are in saturation. SW11 and SW12 are turned on when CK1 is low and are off when CK1 is high. SW13 and SW14 are controlled by CK1 and thus are turned on and off in an opposite fashion to SW11 and SW12. That is, when SW11 and SW12 are on, SW13 and SW14 are off, and vice versa. Inductors L11 and L12 function as current sources to provide bias current through M1, M2, M1_DMY, and M2_DMY. When SW11 and SW12 are off, SW13 and SW14 are turned on to maintain constant bias current through L11 and L12.

The operation of S/H 310 is largely the same as for S/H 210 described above. Input voltages INP and INM are converted to currents through resistors RP1 and RM1. Along with bias current from L11 and L12, the current generated from the input voltages flows through the branches comprising C11/R11 and C12/R12 to generate the voltages OUTP and OUTM. As was the case for FIG. 2, the architecture of FIG. 3 avoids the need for bootstrapping and level-shifted clocks.

S/Hs 210 and 310 are characterized by a pole at the frequency R*C (R is R1 or R2 (or R11, R12) and C is C1 or C2 (or C11, C12). The pole at RC may limit the bandwidth of the circuit below that which may be desirable. Further, when capacitors C1 and C2 are charged for a given sample, the voltages on C1 and C2 may still be present on the capacitors during the next sample thereby representing a memory error which also limits the bandwidth.

Figure 4:
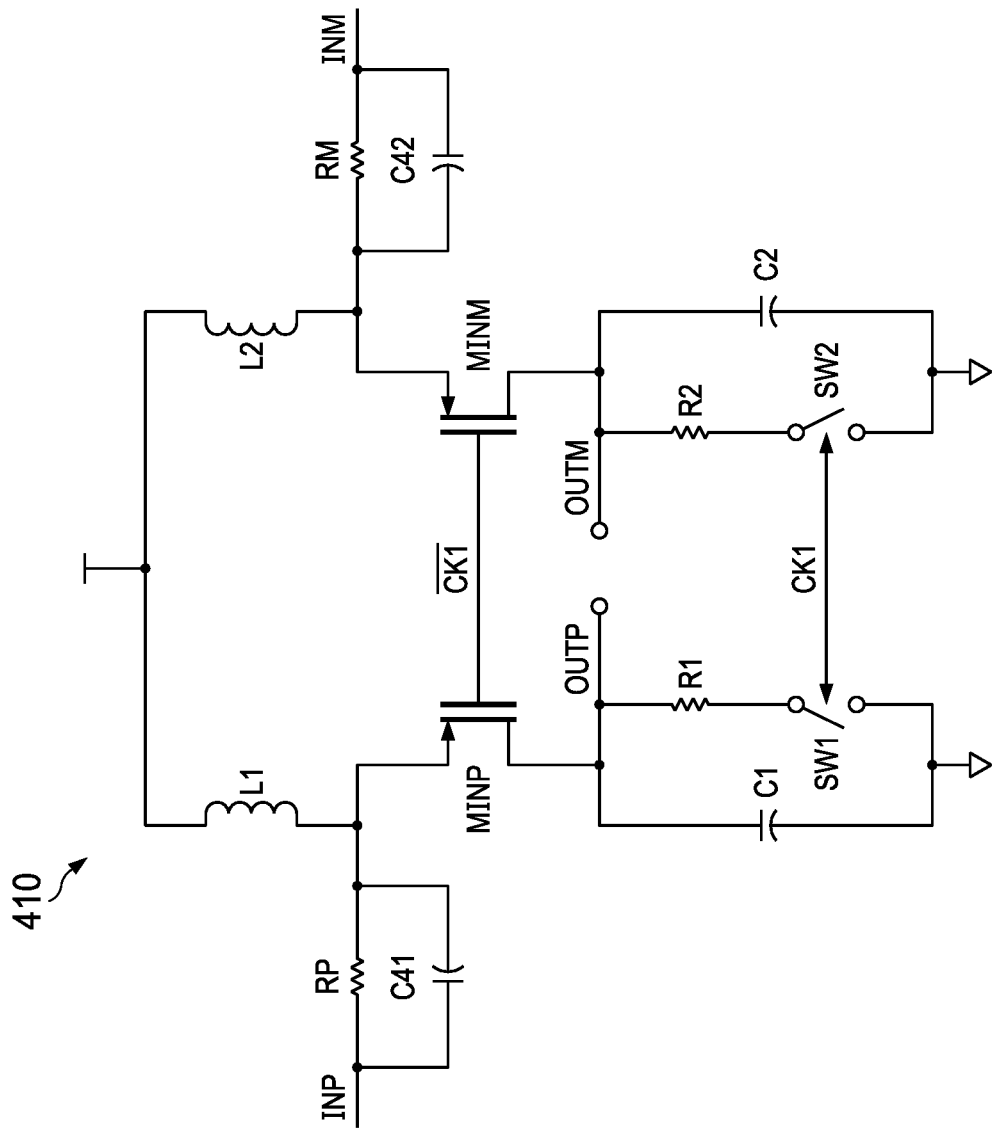
FIG. 4 shows another example of a sample-and-hold circuit.

FIG. 4 is an example of a S/H 410 similar to that of FIG. 2. Neither controller 270 nor branches 250, 252 are shown for simplicity. The S/H of FIG. 4 includes a capacitor C41 coupled in parallel across resistor RP and a capacitor C42 coupled in parallel across resistor RM. The combination of RP/C41 and RM/C42 add zeros to the transfer function. However, capacitors C41 and C42 load the input.

Figure 5:
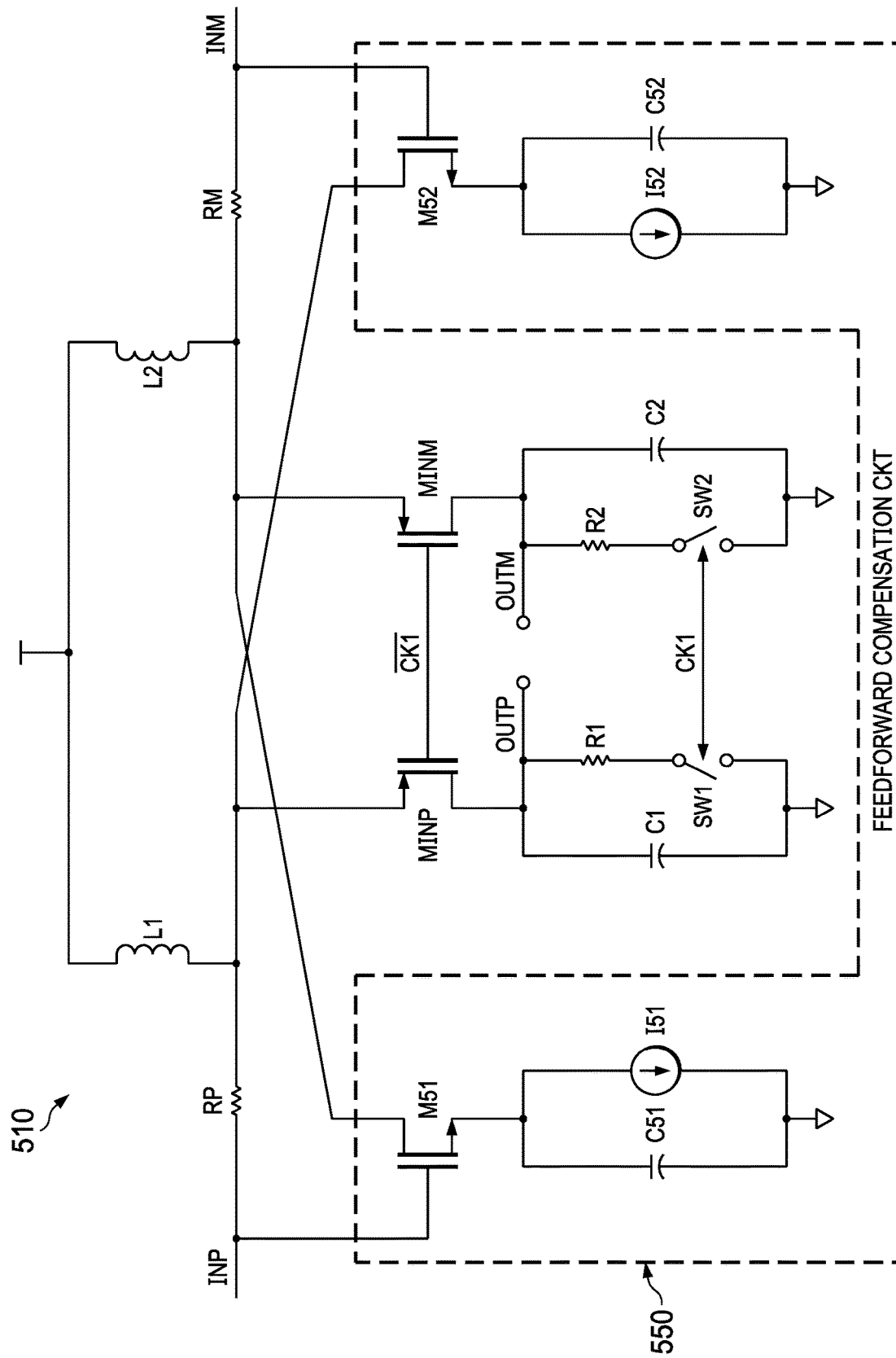
FIG. 5 shows an example of a sample-and-hold circuit with feedforward compensation.

FIG. 5 is an example of a S/H 510 similar to that of FIG. 2. Neither controller 270 nor branches 250, 252 are shown for simplicity. The S/H 510 of FIG. 5 includes a feedforward compensation circuit 550 which is coupled to inputs INP/INM and the sources of MINP and MINM. The example feedforward compensation circuit 550 includes transistors M51 and M52 (both NMOS devices in this example but could be PMOS or others of transistors in other examples), capacitors C512 and C52, and current sources 151 and 152. The gate of M51 is coupled to resistor RP and thus receives input signal INP. The source of M51 is coupled to capacitor C51 and to current source 151. C51 and current source 151 are also coupled to ground. The gate of M52 is coupled to resistor RM and thus receives input signal INM. The source of M52 is coupled to capacitor C52 and to current source 152. C52 and current source 152 are coupled to ground.

The drain of M51 is coupled to the source of MINM and the drain of M52 is coupled to the source of MINP. The combination of RP and C51 and the combination of RM and C52 introduce a continuous-time zero into the transfer function from the INP input to the MINP output and from the INM input to the MINM output. The feedforward compensation circuit 550 provides a current path to the outputs. The voltage on the source of M51 tracks its gate voltage (INP). Because M51's source voltage tracks INP, the current to C51 varies proportional to INP and thus the current to the output node (OUTP) also changes accordingly. Similarly, the voltage on the source of M52 tracks its gate voltage (INM). Because M52's source voltage tracks INM, the current to C52 varies proportional to INM and thus the current to the output node (OUTM) also changes accordingly.

Figure 6:
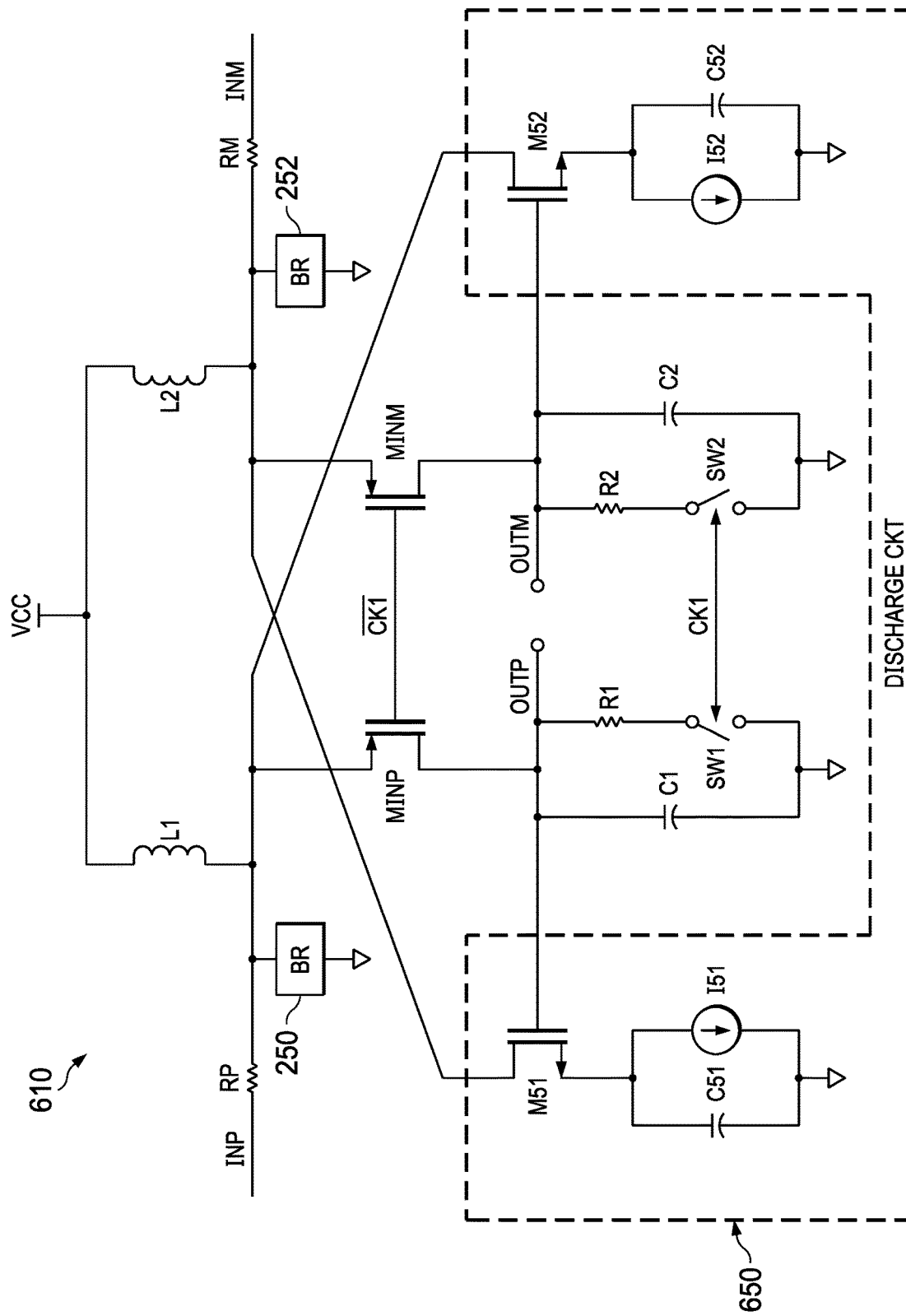
FIG. 6 shows an example of a sample-and-circuit with positive feedback to reduce memory error.

However, the examples of FIGS. 4 and 5 do not address the memory error problem in which the voltage on OUTP/OUTM from a previous sample is still present when a new sample starts thus limiting the bandwidth of the sample-and-hold. FIG. 6 provides an example of a S/H 610 which is similar to that of S/H 510 of FIG. 5. S/H 610 includes a controller (e.g., controller 270 and not shown in FIG. 6) to generate the clocks CK1 and CK1bar. FIG. 6 includes a discharge circuit 650 similar to feedforward compensation circuit 550 with a different configuration in that, whereas the gates of M51 and M52 in FIG. 5 were coupled to the inputs INP and INM, the gate of M51 in FIG. 6 is coupled to the drain of MINP and the gate of M52 is coupled to the drain of MINP. As such, the gate of M51 receives the output signal OUTP and the gate of M52 receives the output voltage OUTM.

The NMOS devices M51 and M52 are in a source-follower configuration which means that their source voltages track their respective gate voltages. Thus, the source of M51 tracks signal OUTP and the source of M52 tracks signal OUTM. The sources of M51 and M52 are coupled to capacitors C51 and C52, respectively. As such, the current through C51 is withdrawn from the output node (OUTM) thereby discharging capacitor C52. Similarly, the current through C52 is withdrawn from the output node (OUTP) thereby discharging capacitor C51. Accordingly, the output nodes (OUTP and OUTM) discharge through the discharge circuit 650 thereby reducing or avoiding the memory error problem.

Figure 7:
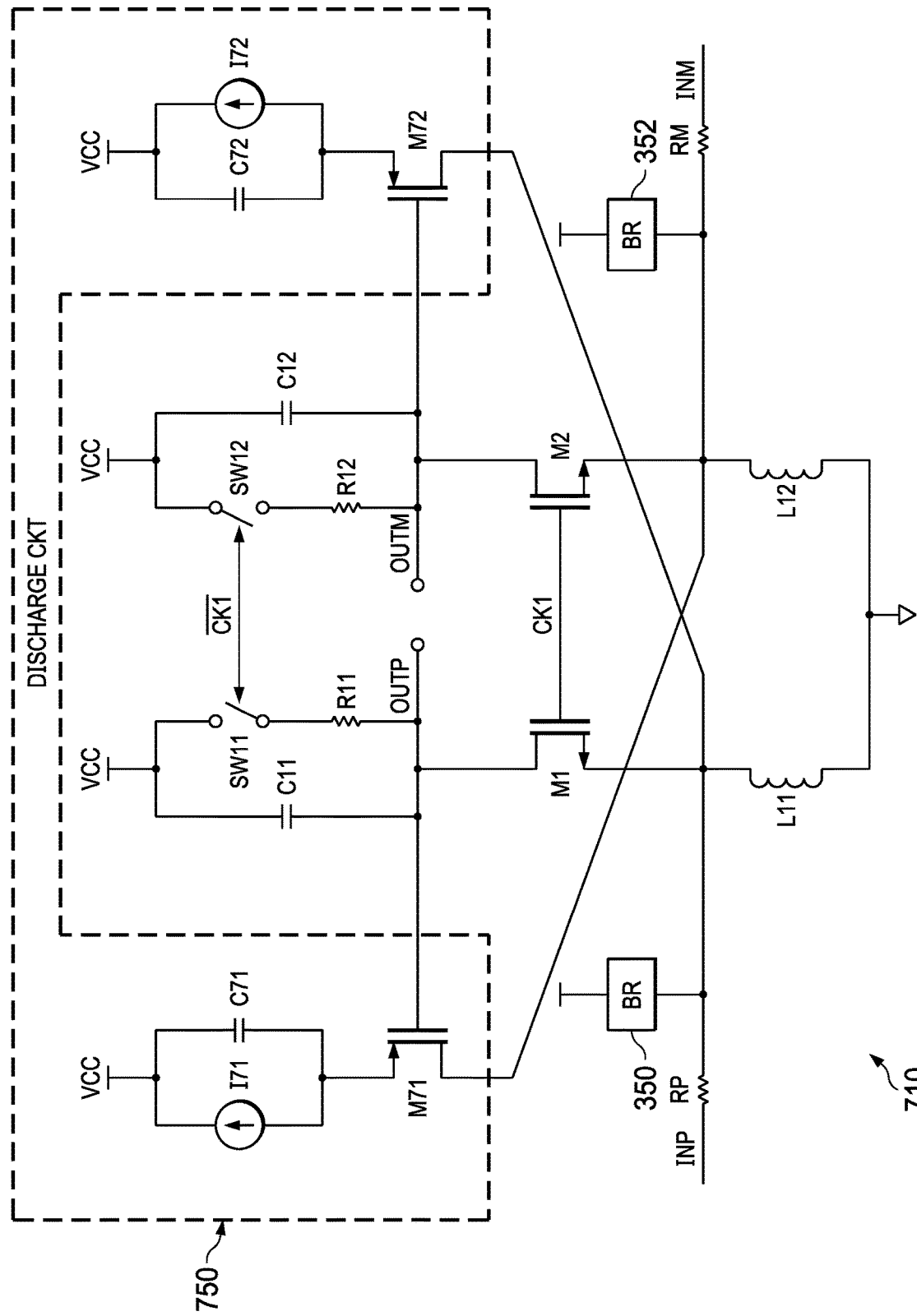
FIG. 7 shows another example of a sample-and-circuit with positive feedback to reduce memory error.

FIG. 7 shows an example of a S/H 710 that is similar to that of the S/H 710 of FIG. 6 but with NMOS devices substituted for PMOS devices, and vice versa. Branch circuits 250, 252 in FIG. 6 are shown as branch circuits 350, 352 in FIG. 7. S/H 710 includes a controller (e.g., controller 270 and not shown in FIG. 7) to generate the clocks CK1 and CK1bar. S/H 710 includes a discharge circuit 750 similar to discharge circuit 650 of FIG. 6. Discharge circuit 750 PMOS transistors M71 and M72, capacitors C71 and C72, and current sources 171 and 172. The source of M71 is coupled to C71 and to 171, and C71 and 171 are in turn coupled to the supply voltage node (VCC). The drain of M71 is coupled to the source of M2 and to L12. The gate of M71 is coupled to the output node (OUTP). The source of M72 is coupled to C72 and to 172, and C72 and 172 are in turn coupled to the supply voltage node (VCC). The drain of M72 is coupled to the source of M1 and to L11. The gate of M72 is coupled to the output node (OUTM). Operationally, discharge circuit 710 functions similar to discharge circuit 610 of FIG. 6 to discharge the output nodes (OUTP and OUTM) to thereby discharge remove the output voltages before the next sample is taken.

Figure 8:
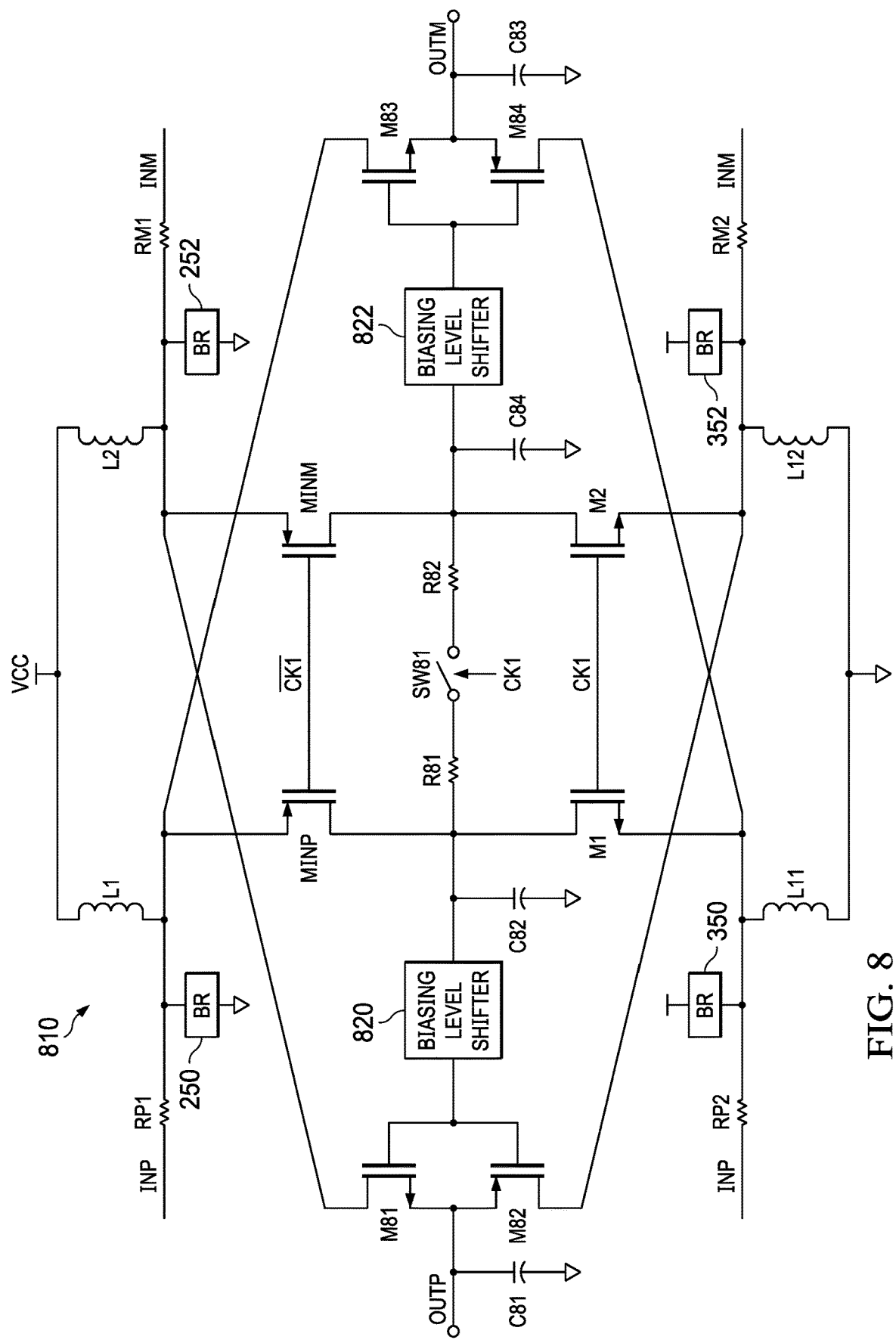
FIG. 8 shows yet another example of a sample-and-hold circuit.

FIG. 8 is an example S/H 810 that combines aspects of S/Hs 610 and 710 of FIGS. 6 and 7. The S/H 810 of FIG. 8 includes inductors L1, L2, L11, and L12, transistors MINP, MINM, M1, M2, M81, M82, M83, and M84, resistors RP1, RP2, RM1, RM2, R81, and R82, capacitors C81, C82, C83, and C84, bias level shifters 820 and 822, branch circuits 250, 252, 350, and 352, and switch SW81. The source of MINP is coupled to inductor L1. The drains of MINP and M1 are coupled together, and the source of M1 is coupled to L11. The source of MINM is couple to inductor L2. The drains of MINM and M2 are coupled together, and the source of M2 is coupled to L12. The gates of MINP and MIN are coupled together and are driven by CK1bar. The gates of M1 and M2 are coupled together and are driven by CK1.

Resistors RP1 and RP2 comprise input nodes and receive input signal INP. Resistors RM1 and RM2 comprise input nodes and receive input signal INM. Branch circuits 250, 252, 350, and 352 are coupled to their respective resistors RP1, RM1, RP2, and RM2 as shown and as described previously. One terminal of R81 is coupled to the drain of M1 and to C82. The other terminal of R81 is coupled to switch SW81. Similarly, one terminal of R82 is coupled to the drain of M2 and to C84. The other terminal of R82 is coupled to SW81.

One terminal of bias level shifter 820 is coupled to C82 and R81 and the other terminal of bias level shifter 820 is coupled to the gates of M81 and M82. The sources of M81 and M82 are coupled together and to C81. The voltage on the sources of M81 and M82 and capacitor C81 is the output signal OUTP. Similarly, one terminal of bias level shifter 822 is coupled to C84 and R82 and the other terminal of bias level shifter 822 is coupled to the gates of M83 and M84. The sources of M83 and M84 are coupled together and to C83. The voltage on the sources of M83 and M83 and capacitor C83 is the output signal OUTM. The bias level shifters 820 may comprise voltage dividers to level shift the voltage of C82 and C84 to appropriate levels for their respective transistors M81-M84. The drain of M81 is coupled to RM1 and the drain of M83 is coupled to RP1. The drain of M82 is coupled to RM2 and the drain of M84 is coupled to RP2.

The operation of the circuit in FIG. 8 is similar to the FIGS. 6 and 7 but utilizes both PMOS and NMOS transconductances thereby saving power compared to the circuits of FIGS. 6 and 7 (e.g., 50% power savings). The input voltage in FIG. 8 is converted into current via both RP1/RP2 (and RM1/RM2) equally and this current flows through the transconductors MINP, M1 (and MINM, M2) and into the output load R81, C82 (and R82, C84). The capacitors C82 and C84 have memory from previous samples which impacts the output. This memory effect is mitigated by using the source followers, again in CMOS configuration to save power, M81/M82 and M83/M84 in a current feedback configuration. M81/M82 respond to the output of R81 and C82 and carry a current proportional to the current to C81. This current is added to the output branch of MINM and M2, thereby providing the current required for C84. In this way, the memory "stored" in C82 and C84 is cancelled via the source follower branches.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A sample-and-hold circuit, comprising:
   a first resistor having a first terminal and a second terminal wherein the second terminal is coupled to a first current source;
   a second resistor having a first terminal and a second terminal wherein the second terminal is coupled to a second current source;
   a first transistor having a control terminal, a first current terminal and a second current terminal, wherein the first current terminal is coupled to the second terminal of the first resistor;
   a second transistor having a control terminal, a first current terminal and a second current terminal, wherein the first current terminal is coupled to the second current terminal of the first transistor and the second terminal of the second transistor is coupled to the second terminal of the second resistor;
   a third resistor having a first terminal and a second terminal wherein the second terminal is coupled to a third current source;
   a fourth resistor having a first terminal and a second terminal wherein the second terminal is coupled to a fourth current source;
   a third transistor having a control terminal, a first current terminal and a second current terminal, wherein the first current terminal is coupled to the second terminal of the third resistor;
   a fourth transistor having a control terminal, a first current terminal and a second current terminal, wherein the first current terminal is coupled to the second current terminal of the third transistor and the second terminal of the second transistor is coupled to the second terminal of the fourth resistor;
   a first capacitor having a first terminal and a second terminal wherein the first terminal is coupled to the second current terminal of the first transistor and the second terminal is coupled to ground; and
   a second capacitor having a first terminal and a second terminal wherein the first terminal is coupled to the second current terminal of the third transistor and the second terminal is coupled to ground;
   wherein the control terminals of the first and third transistors are coupled together, the control terminals of the second and fourth transistors are coupled together, and the control terminals are controlled by the complementary signals.

2. The sample-and-hold circuit of claim 1, further comprising:
   a fifth transistor having first and second current terminals and a control terminal, wherein the first current terminal of the fifth transistor is coupled to the second terminal of the third resistor; and
   a sixth transistor having first and second current terminals and a control terminal, wherein the second current terminal of the sixth transistor is coupled to the second terminal of the fourth resistor;
   wherein the control terminals of the fifth and sixth transistors are coupled together.

3. The sample-and-hold circuit of claim 2, further comprising:
   a seventh transistor having first and second current terminals and a control terminal, wherein the first current terminal of the seventh transistor is coupled to the second terminal of the first resistor; and
   an eighth transistor having first and second current terminals and a control terminal, wherein the second current terminal of the eighth transistor is coupled to the second terminal of the second resistor;
   wherein the control terminals of the seventh and eighth transistors are coupled together.

4. The sample-and-hold circuit of claim 3, further comprising:
   a fifth resistor having a first terminal and a second terminal wherein the first terminal is coupled to the second current terminal of the first transistor;
   a sixth resistor having a first terminal and a second terminal wherein the first terminal is coupled to the second current terminal of the third transistor;
   a first biasing level shifter coupled to the control terminals of the fifth and sixth transistors and to the second current terminal of the first transistor;
   a second biasing level shifter coupled to the control terminals of the seventh and eighth transistors and to the second current terminal of the third transistor.

5. The sample-and-hold circuit of claim 1, wherein the first current source comprises a first inductor having a first terminal and a second terminal wherein the first terminal is coupled to a voltage source and the second terminal is coupled to the second terminal of the first resistor.

6. The sample-and-hold circuit of claim 5, wherein the second current source comprises a second inductor having a first terminal and a second terminal wherein the first terminal is coupled to ground and the second terminal is coupled to the second terminal of the second resistor.

7. The sample-and-hold circuit of claim 6, wherein the third current source comprises a third inductor having a first terminal and a second terminal wherein the first terminal is coupled to the voltage source and the second terminal is coupled to the second terminal of the third resistor.

8. The sample-and-hold circuit of claim 7, wherein the fourth current source comprises a fourth inductor having a first terminal and a second terminal wherein the first terminal is coupled to ground and the second terminal is coupled to the second terminal of the fourth resistor.

9. The sample-and-hold circuit of claim 4, further comprising a first branch circuit coupled to the second terminal of the first resistor.

10. The sample-and-hold circuit of claim 9, further comprising a second branch circuit coupled to the second terminal of the second resistor.

11. The sample-and-hold circuit of claim 10, further comprising a third branch circuit coupled to the second terminal of the third resistor.

12. The sample-and-hold circuit of claim 11, further comprising a fourth branch circuit coupled to the second terminal of the fourth resistor.

\* \* \* \* \*